(12) United States Patent
Yamaguchi

(10) Patent No.: US 6,370,004 B1
(45) Date of Patent: Apr. 9, 2002

(54) ELECTROSTATIC CHUCK

(75) Inventor: Shinji Yamaguchi, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/407,051

(22) Filed: Sep. 27, 1999

(30) Foreign Application Priority Data

Sep. 29, 1998 (JP) .......................... 10-274506

(51) Int. Cl.⁷ .............................................. H02N 13/00
(52) U.S. Cl. ...................................... 361/234; 279/128
(58) Field of Search ........................... 361/234; 279/128

(56) References Cited

U.S. PATENT DOCUMENTS

| | | | | |
|---|---|---|---|---|
| 5,160,152 A | * | 11/1992 | Toraguchi et al. | 361/234 |
| 5,530,616 A | * | 6/1996 | Kitabayashi et al. | 361/234 |
| 5,761,023 A | * | 6/1998 | Lue et al. | 361/234 |
| 5,880,923 A | * | 3/1999 | Hausmann | 361/234 |
| 6,028,762 A | * | 2/2000 | Kamitani | 361/234 |

FOREIGN PATENT DOCUMENTS

| | | | |
|---|---|---|---|
| JP | 5-226462 | 9/1993 | H01L/21/68 |
| JP | 5-267436 | 10/1993 | H01L/21/68 |
| JP | 8-55900 | 2/1996 | H01L/21/68 |

* cited by examiner

*Primary Examiner*—Ronald W. Leja
(74) *Attorney, Agent, or Firm*—Burr & Brown

(57) ABSTRACT

An electrostatic chuck includes a substrate, inner electrode and outer electrodes each made of a metal and concentrically buried in the substrate. A plurality of embossed portions are formed on a main plane of the substrate. A projecting portion is made of the same material as that of said plurality of the embossed portions and is formed on substantially an entire outer peripheral portion on the main plane of the substrate on which the embossed portions are formed. When positive and negative potentials are to be applied to the inner and outer electrode, respectively, or vice versa, an object to be treated is supported by the embossed portions and the projecting portion. A sum of a total area of upper surfaces of the embossed portions in an outer electrode-located zone of the substrate and an area of an upper surface of the projecting portion in the outer electrode-located zone of the substrate is in a range of 0.7 to 1.3 of a total area of upper surfaces of the embossed portions in an inner electrode-located zone of the substrate.

14 Claims, 4 Drawing Sheets

ELECTROSTATIC CHUCK

BACKGROUND OF THE INVENTION

(1) Field of the Invention

The present invention relates to an electrostatic chuck, and particularly to an electrostatic chuck for holding a wafer in a semiconductor-producing apparatus.

(2) Related Art Statement

At present, electrostatic chucks are used for attracting and holding semiconductor wafers in finely working, e.g., transferring, exposing, film-forming by CVD, washing, etching, and ding the semiconductor wafers.

As disclosed in, for example, JP-A 8-55,900, such an electrostatic chuck consists of a discoid positive electrode 2 and a discoid negative electrode 3 buried in a substrate 1 made of a ceramic material or the like as shown in FIGS. 1 and 2. An object 7 to be treated, such as a semiconductor wafer, is attracted onto a main plane 1A of the substrate 1 through an electric field generated by applying a given voltage between the electrodes from a DC power source 6. FIG. 2 is a plane view of the electrostatic chuck of FIG. 1 as viewed from an upper side. In FIG. 2, the object 7 is omitted for facilitating the explanation.

The prior art electrostatic chuck has a relatively large electrode gap 8 between the positive and negative electrodes 2 and 3, which results in an electric field that is insufficient to hold the object 7 to be treated near the gap 8 between the electrodes.

For the above reason, the object 7 does not fully contact the main plane 1A of the substrate 1 at the gap between the electrodes. Consequently, heat is not fully conducted to the object 7 from the substrate and the entire object 7 cannot be uniformly heated.

Further, since the attracting force may vary dependent upon any difference in a buried depth between the positive and negative electrodes 2 and 3 and different polarities of the applied voltage, the degree for the object 7 to contact the main plane 1A of the substrate 1 differs between a zone where the positive electrode 2 is positioned and a zone where the negative electrode 3 is positioned, which causes variations in the heat conductivity.

SUMMARY OF THE INVENTION

It is therefore an objective of the present invention to provide an electrostatic chuck which can uniformly attract an object to be treated and uniformly transfer heat to that object.

The present invention relates to an electrostatic chuck comprising a substrate having an inner electrode and an outer electrode made of a metal concentrically buried therein. A plurality of embossed portions are formed on a main plane of the substrate. A projecting portion is made of the same material as that of the plurality of embossed portions and is formed on substantially an entire outer peripheral portion on the main plane of the substrate on which said plurality of the embossed portions are formed. When positive and negative potentials are applied to the inner and outer electrode, respectively, or vice versa, an object to be treated is supported by the plurality of embossed portions and the projecting portion. A sum of a total area of upper surfaces of the embossed portions and the projecting portion in a zone of the substrate in which the outer electrode is located is in a range of 0.7 to 1.3 of a total area of upper surfaces of the embossed portions in a zone of the substrate in which the inner electrode is located.

These and other objects, features and advantages of the invention will be apparent from reading the following description of the invention and attached drawings, with the understanding that some modifications, variations and changes of the same could be easily made by the skilled person in the art to which the invention pertains.

BRIEF DESCRIPTION OF THE ATTACHED DRAWINGS

For a better understanding the invention, reference is made to the attached drawings, wherein.

DETAILED DESCRIPTION OF THE INVENTION

Figure 3A:
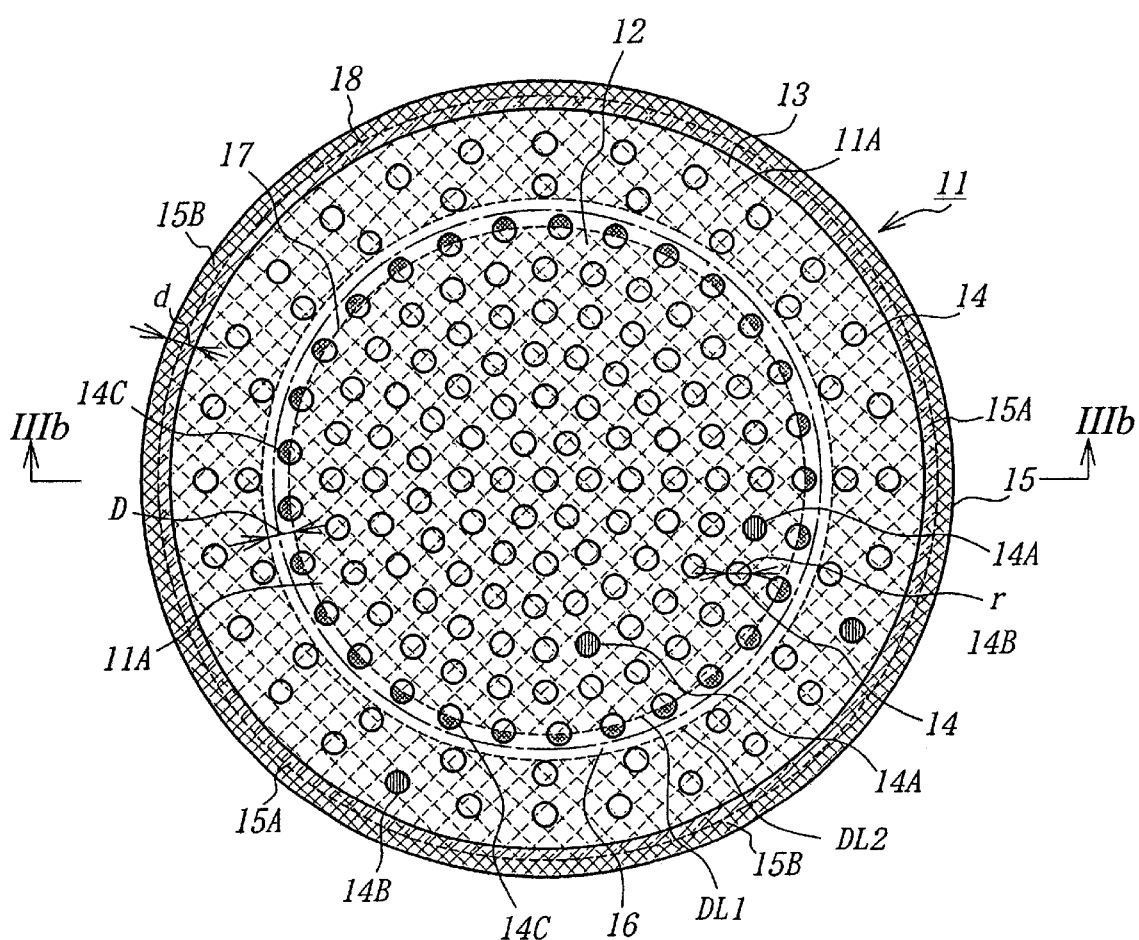
FIG. 3(a) is a plane view of an embodiment of the electrostatic chuck according to the present invention.

FIG. 3(a) is a plane view of an embodiment of the electrostatic chuck according to the present invention. FIG. 3(a) illustrates an outward appearance of the electrostatic chuck as viewed from the upper side. In FIG. 3(a), the object to be treated is not shown.

Figure 3B:
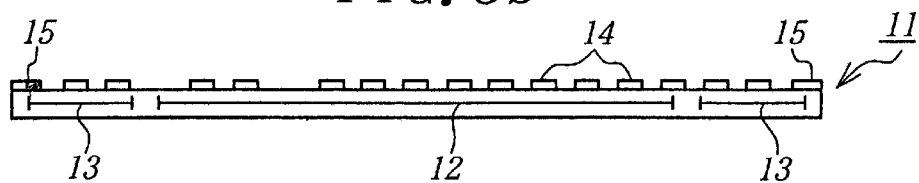
FIG. 3(b) is a cross sectional view of FIG. 3(a) along line

As shown in FIGS. 3(a)–3(b), in the electrostatic chuck according to the present invention, an inner electrode 12 and an outer electrode 13 are concentrically arranged in a substrate 11. Positive and negative potentials are applied to the inner and outer electrode, respectively, or vice versa, so that an electric field, i.e., an attracting force, can be uniformly formed as viewed in a circumferential direction.

Further, a plurality of embossed portions 14 are formed on a main plane 11A of a substrate. A projecting portion 15 is formed of the same material as that of said plurality of the embossed portions on an entire outer peripheral portion on the main plane 11A of the substrate 11. A sum of a total area of upper surfaces 14B of the embossed portions 14 in a zone 18 of the substrate in which the outer electrode 13 is located and an area of an upper surface 15A of said projecting portion 15 in a zone of the substrate in which the outer electrode is located (this zone being a zone of the substrate outwardly defined by a dotted line DL 2) is in a range from 0.7 to 1.3 of a total area of upper surfaces 14A of the embossed portions 14 in a zone of the substrate in which the inner electrode 12 is located (this zone being a zone 17 of the substrate internally defined by a dotted line DL 1). An object to be treated is supported by the embossed portions and the projecting portion. Therefore, the attracting force is exerted upon the object by the electrodes uniformly as viewed in the circumferential direction of the object. Thus, the object to be treated can be uniformly heated.

Further, a positively charged amount of the object to be treated is equal to a negatively charged amount thereof, so that they are offset with each other to prevent the object from being charged. Therefore, electric breakdown due to discharging between the object and a member near it can be prevented.

Furthermore, since the object is in an intermediate potential for the applied positive and negative potentials, the attracting force between the object and one of the electrodes is equal to that between the object and the other.

As shown in FIGS. 3(a)–3(b), the wording "the total area of upper surfaces of the embossed portions in a zone of the substrate in which the inner electrode is located" means the total area of the upper surfaces 14A of the embossed portions which exist inside the zone 17 in which the inner electrode 12 is located. In other words, this total area is a value obtained by subtracting the total area of the upper surfaces 14c of the embossed portions (See black parts of the upper surfaces of the embossed portions crossing the dotted line DL1) from the total area of the upper faces 14A of the embossed portions 14 overlapping with the zone 17.

Similarly, the wording "the total area of upper surfaces of the embossed portions in a zone of the substrate in which the outer electrode is located" means the total area of the upper surfaces 14B of the embossed portions 14 which overlap the zone 18 in which the inner electrode 12 is located.

The term "upper surface of the embossed portion" used herein means a contact surface of the embossed portion between an object to be treated in the state that the object is placed on the electrostatic chuck. Since the object is generally a planar object such as a wafer, it is preferable that the upper surfaces of a plurality of the embossed portions and that of the projecting portion are substantially flat and flush with one another. It is preferable that the embossed portion has a pillar shape, for example, a pillar shape with a polygonal section, a pillar shape with a round section or a pillar shape with an elliptical section.

Further, as shown in FIGS. 3(a) and 3(b), the wording "an area of an upper surface of said projecting portion in a zone of the substrate in which the outer electrode is located" means the area of the upper surface 15A of the projecting portion which overlaps with the zone 18 in which the outer electrode 13 is located. In other words, it means the area of the upper surface part 15B (See a network pattern surface portion) of the projecting portion outside the zone 18 in which the outer electrode is positioned from the area of the upper surface 15A of the projecting portion 15.

In the present invention, assuming that the total area of the upper surfaces of the embossed portions formed in the zone of the main plane of the substrate where the inner electrode is located is taken as 1, the sum between the total area of upper surfaces of the embossed portions in a zone of the main plane of the substrate in which the outer electrode is located and the area of the upper surface of the projecting portion in the zone of the substrate in which the outer electrode is located is in a range of 0.7 to 1.3. In other words, the above means the following inequalities:

$$0.7 \leq \frac{V_I - V_W}{V_W - V_O} \leq 1.3$$

in which $V_I$ is a potential applied to the inner electrode, $V_W$ is a potential generated in the object placed on the electrostatic chuck for treatment, and $V_O$ is a potential applied to the outer electrode.

The present invention will be explained in more detail based on preferred embodiments of the present invention with reference to the drawings.

A first preferred embodiment of the electrostatic chuck according to the present invention has a plane view as shown in FIG. 3(a). In this embodiment, the area of the zone 17 of the substrate in which the inner electrode 12 is located is substantially in a range of 0.7 to 1.3 that of the zone 18 of the substrate in which the outer electrode 13 is located. The density of the embossed portions on the main plane 11A of the substrate 11 in the zone 17 in which the inner electrode 12 is located is larger than that of the embossed portions on the main plane 11A of the substrate 11 in the zone 18 in which the outer electrode 13 is located.

By so constructing, since the object is more closely contacted with the inner side of the electrostatic chuck, the heat conductivity in the inner side can be made larger. For this reason, when a high frequency voltage is applied between the inner electrode 12 and the outer electrode 13, the outer side of the object can be prevented from being heated to a high temperature with the heat of plasma.

However, the above construction is not necessarily indispensable to attain the objective of the present invention, and any other construction may be employed so long as the requirements of the present invention are satisfied.

In this embodiment, a negative potential is applied to the inner electrode 12, whereas a positive potential is applied to the outer electrode 13. However, the inner electrode 12 and the outer electrode 13 should be concentrically formed to attain the objective of the present invention. Therefore, it may be that a positive potential is applied to the inner electrode 12 and a negative potential is applied to the outer electrode 13.

If the negative and positive potentials are applied to the inner and outer electrodes 12 and 13, respectively, the density of lines of the electric force can be increased so as to more firmly attract the object to the substrate. The reason for this has not been clarified.

The size of a gap between the electrodes is not particularly limited so long as the inner electrode 12 can be electrically insulated from the outer electrode. However, the electrodes are so arranged that the width D of the gap may be generally 2 to 10 mm.

The configuration of the embossed portions 14 is not particularly limited so long as the total areas of the upper surfaces 14A and 14B satisfy the above-mentioned requirement. Any shape such as a cylindrical shape as well as a rectangular-section shape or a parallelepiped shape may be employed so long as the upper faces of the embossed portions are flat.

With respect to the projecting portion 15 formed on the outer peripheral portion of the main plane 11A of the substrate 11, any shape may be employed so long as the area of the upper face 15A satisfies the above requirement.

Each of the embossed portions 14 and the projection 15 is not particularly limited in size, and may be formed arbitrarily depending upon the use of the electrostatic chuck. If cylindrical embossed portions and an annular projecting portion are employed as shown in FIG. 3(a), it is preferable that the diameter "r" of the embossed portion is 1 to 8 mm, and the thickness "d" of the annular projecting portion is 1 to 8 mm. The height of each of the embossed portions and the annular portion is preferably 5 to 50 mm.

Further, the number of the embossed portions 14 is not particularly limited. It is necessary to disperse the pressure at which the object to be treated is supported in order to uniformly hold the object and more effectively attain the objective of the present invention. Therefore it is preferable that the rate of the embossed portions 14 is 2 to 4/cm² in the concentric area 17 in which the inner electrode is located and 1 to 2/cm² in the concentric area 18 in which the outer electrode is located.

In the electrostatic chuck having the construction as shown in FIG. 3(a), each of the total area of the upper surfaces 14A of the embossed portions 14 in the inner electrode zone 17 and the sum of the total area of upper surfaces 14B of the embossed portions in the outer electrode zone and the area of the upper surface 15A of said projecting portion 15 in the outer electrode zone is set at 20 to 200 cm² for the plane having the diameter of 200 mm so that the object to be treated can be firmly supported.

Although the embossed portions 14 and the projecting portion 15 must be formed of the same material, the material employed is not particularly limited to any material, so long as the object to be treated can be uniformly supported. For example, AlN or $Al_2O_3$ may be used as such a material.

The embossed portions 14 and the projecting portion 15 is formed on the main plane 11A of the substrate by blast working or CVD.

As the substrate 11, a known ceramic material usable in the electrostatic chucks, such as AlN or $Al_2O_3$ may be used. As for the inner electrode 12 and the outer electrode 13, a known metallic electrode material such as Mo or W may be used.

The substrate 11 may be produced by a known method, for example, by forming a molded body of ceramic material particles in a given shape, placing the inner electrode 12 and the outer electrode 13 on the molded body, charging the ceramic particles on it, molding the particles, and firing the resulting assembly, thereby realizing a state in which the inner electrode 12 and the outer electrode 13 are buried in the fired body.

Figure 4:
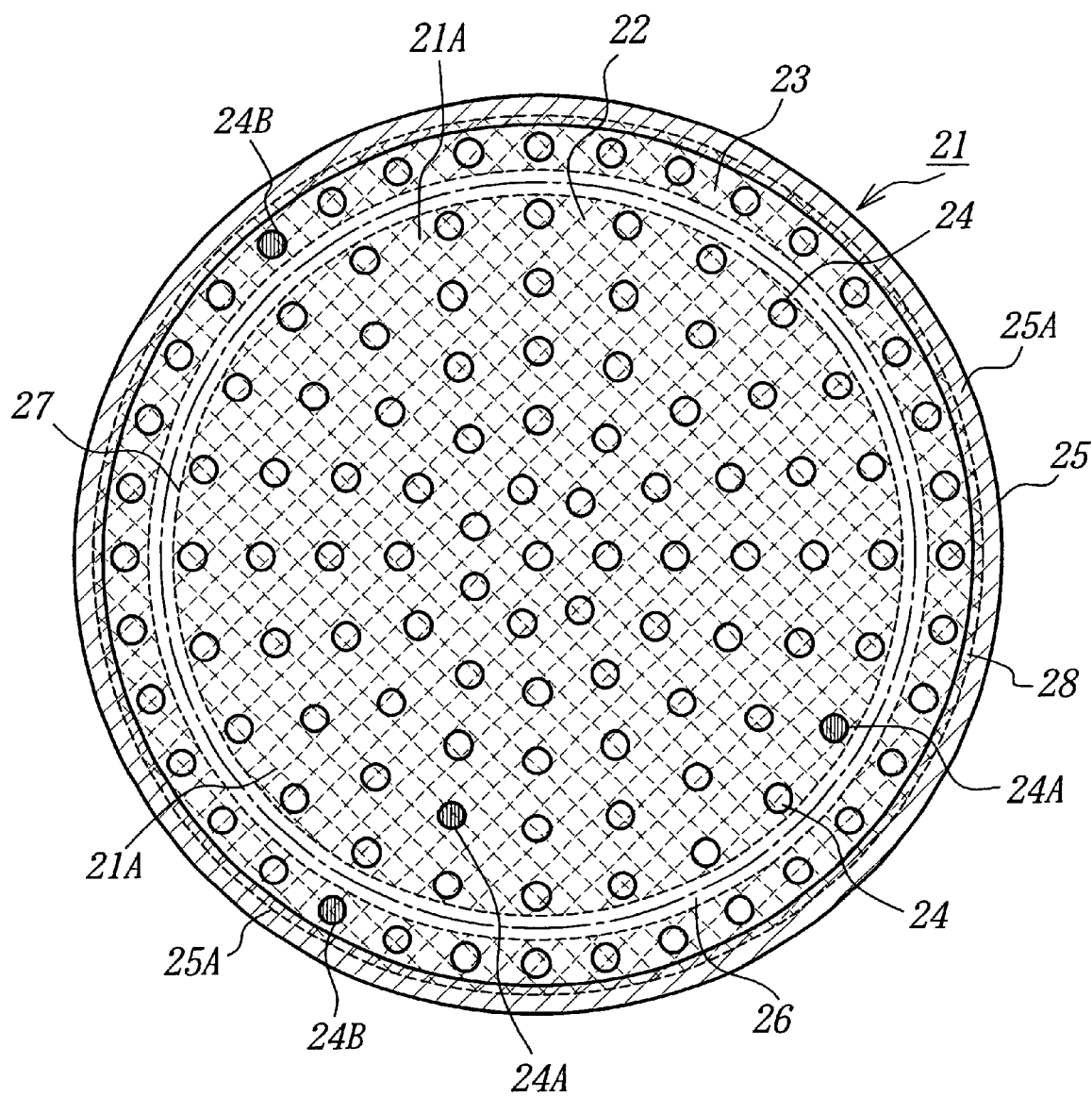
FIG. 4 is a plane view of another embodiment of the electrostatic chuck according to the present invention.

FIG. 4 shows a plane view of another embodiment of the electrostatic chuck according to the present invention. In FIG. 4, a zone 27 in which an inner electrode 22 is located is larger than a zone 28 where an outer electrode 23 is located. Whereas the density of the embossed portions 24 in the inner electrode zone 27 on the main plane 11A of the substrate 11 where the inner electrode 22 is located is equal to that of the embossed portions 24 where the outer electrode 23 is located.

By employing such a construction, the contacting density between the electrostatic chuck and the object to be treated is uniform over the inner and outer portions. Therefore, heat can be conducted from the electrostatic chuck to the object, so that the object can be uniformly heated.

In such a case, the objective of the present invention can be realized so long as the requirements according to the present invention, such as those imposed upon the total area of the upper surfaces 24A of the embossed portions 24, are satisfied.

In FIG. 4, a negative potential and a positive potential are applied to the inner and outer electrodes 22 and 23, respectively. However, this is not particularly restrictive, so long as those electrodes are concentrically arranged. That is, a positive potential and a negative potential may be applied to the inner and outer electrodes 22 and 23, respectively. However, it is preferable for the same reason as in FIG. 3 that the negative potential and the positive potential are applied to the inner and outer electrodes 22 and 23, respectively.

Further, with respect to each of the embossed portions 24 and the projecting portion 25, the same size and the same shape as in FIG. 3 may be employed, and the embossed portions and the projecting portion may be formed, on a main plane 21A of a substrate 21, of the same material in the same manner as in FIG. 3.

Figure 5:
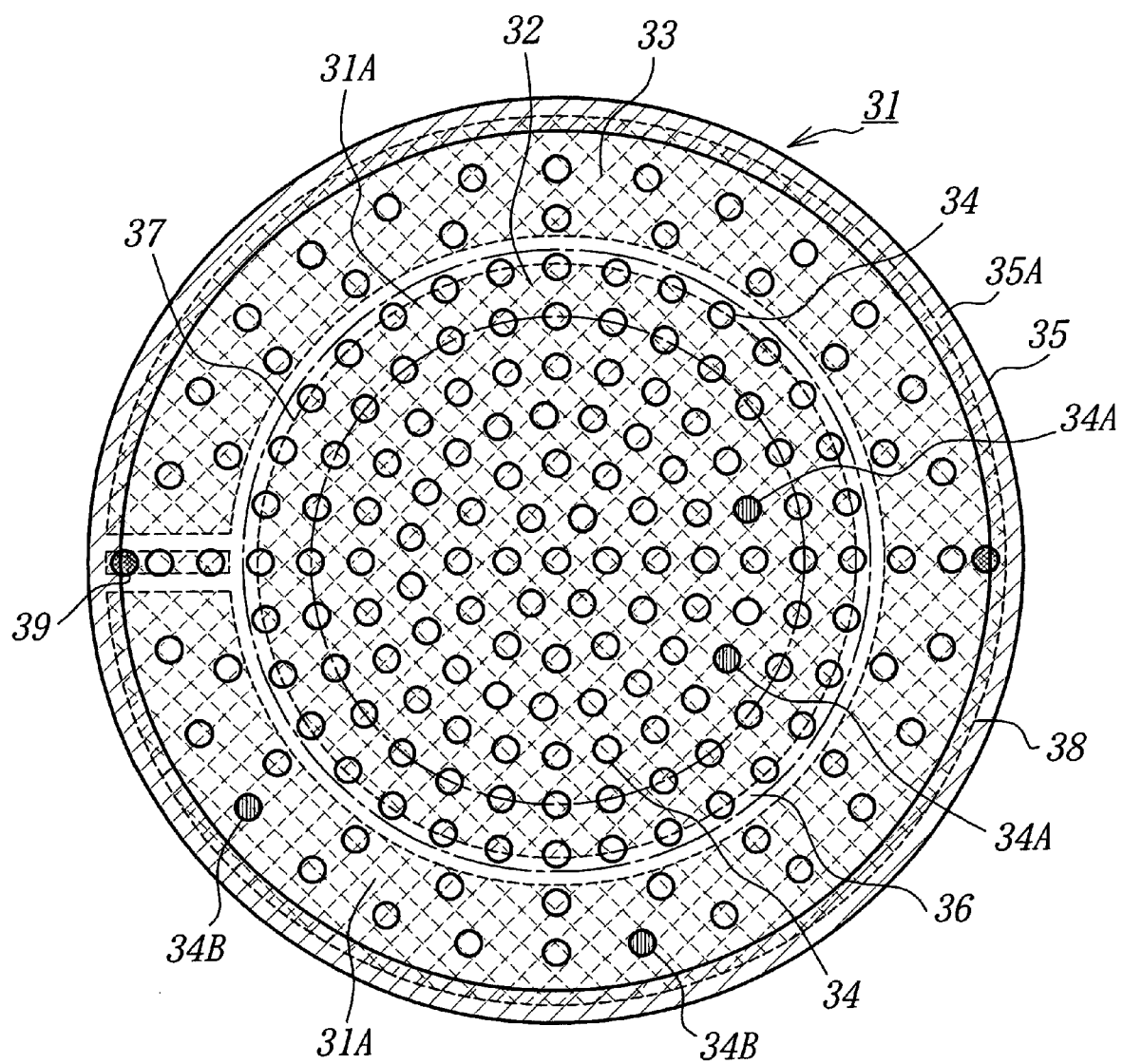
FIG. 5 is a further embodiment of the electrostatic chuck according to the present invention.

FIG. 5 shows a case where an inner electrode terminal 39 for an inner electrode is formed in an outer electrode 33 in an electrostatic chuck as shown in FIG. 3. When the inner electrode terminal 39 is formed in the electrode portion of the substrate 31 like this, a voltage applying part such as a wire needs not be arranged near the center of the substrate, so that a positional limitation in attaching the device can be diminished. For example, this is effective, since the number of parts interrupting light is decreased in heating the electrostatic chuck with a lamp.

In this way, the objective of the present invention can be realized in a case where the outer electrode 33 is interrupted and discontinued in its circumferential direction by the provision of the inner electrode terminal 39, so long as the requirements according to the present invention are satisfied.

The other matters may be effected in the same manner as in FIG. 3, including the materials usable for the embossed portions 34, etc. and their producing processes.

In the electrostatic chucks shown in FIGS. 3 to 5, a back side gas may be introduced into a space between the embossed portions 14, the object to be treated, and the projecting portion 15 through a line (not shown) arranged at a rear surface of the electrostatic chuck.

By so doing, the heat conductivity from the main plane of the substrate to the object to be treated can be enhanced, so that the object can be more uniformly heated.

A back side gas, such as He gas, Ar gas or the like may be used.

In general, since the above introducing line is formed at a central portion of the substrate, the back side gas is introduced into a central portion of the space between the embossed portions, the object to be treated and the projecting portion.

After the object to be treated is attracted to the electrostatic chuck, the back side gas is introduced, and simultaneously the object begins to be heated to actuate a film-forming process.

Therefore, as the area of the substrate constituting the electrostatic chuck becomes relatively large, it may take a relatively long time for the back side gas to reach an edge portion of the space defined by the embossed portions, the projecting portion and the object to be treated. Owing to this, the temperature of the object to be treated may be non-uniform, depending upon the non-uniformity of the back side gas immediately after the film-forming process has started, which causes variations in various film characteristics.

In such a way, as shown in FIG. 4, when the area of the inner electrode is larger than that of the outer electrode, that is, the area of the outer electrode is smaller than that of the inner electrode, and the total area of the upper surfaces of a plurality of the embossed portions per a unit area of the electrode in the zone where the outer electrode is located is larger than the total area of the upper surfaces of a plurality of the embossed portions per a unit area of the electrode in the zone where the inner electrode is located, a rate at which a portion of the object located at an edge portion of the above space is directly heated by the embossed portions increases.

Therefore, the object can be uniformly treated from the beginning of the film-forming process, while compensating for the non-uniformity of the back side gas. Further, since the requirement for the area of the embossed portions are satisfied, the objective of the present invention can be also effectively accomplished.

The total area of the upper surfaces of a plurality of the embossed portions in the zone where each of the inner and outer electrodes is located can be increased or decreased by varying the density of the embossed portions in the zone where the electrode is located or by varying the diameter of the embossed portions.

EXAMPLE

The present invention will be more concretely explained based on an example.

This example is based upon the use of electrostatic chucks in which the area of the inner electrode was equal to that of the outer electrode, and a positive potential and a negative potential were applied to the inner and outer electrodes as shown in FIG. 3, respectively.

As illustrated in the above embodiments of the present invention, a molded body was formed by molding AlN ceramic powder to be used as a substrate 11 in a given shape, metallic electrodes made of Mo were placed on the molded body, the above ceramic powder was applied onto the resulting molded body and molded again to form a final molded body in which the metallic electrodes were buried. The molded body was then sintered in a nitrogen atmosphere to produce a substrate having a diameter of 200 mm in which an inner electrode 12 and an outer electrode 13 were buried.

By employing the same method as explained in the embodiment according to the present invention, embossed portions 14 each having a diameter of 3 mm and a height of 20 were formed of AlN on the above substrate 11 at a ratio of 3 embossed portions/$cm^2$ in the zone 17 of the main plane 11A of the substrate 11 where the inner electrode 12 is located and at a ratio of 1/$cm^3$ in the zone 17 where the outer electrode 12 is located.

A projecting portion 15 made of AlN was formed at an outer edge portion with a width of 2 mm.

At that time, each of the total area of the upper surfaces 14A of the embossed portions 14 in the zone 17 where the inner electrode was located and a sum of the total area of the upper surfaces 14B of the embossed portions 14 in the zone 18 where the outer electrode was located and the area of the upper surface 15A of the projecting portion 15 was 63 $cm^2$. A gap 16 between the inner electrode 12 and the outer electrode 13 was 4 mm in width D.

An Si wafer having a diameter of 200 mm as an object to be treated was placed on the embossed portions 14 and the projecting portion 15 of the thus produced electrostatic chuck. An electric field was formed by applying a DC voltage between the inner electrode 12 and the outer electrode 13, so that the Si wafer was attracted onto the electrostatic chuck in this Example.

Then, a back side gas of Ar gas was fed and uniformly charged into the space between the Si wafer and the substrate 11 through a line (not shown) and the Si wafer was heated to 350° C. by heating the substrate 11.

At that time, the temperature distribution of the surface of the Si wafer was examined by TC (Thermo Couple), which revealed that the variation in the temperature over the entire surface of the wafer was ±3° C. for the above 350° C.

Comparative Example

Figure 1:
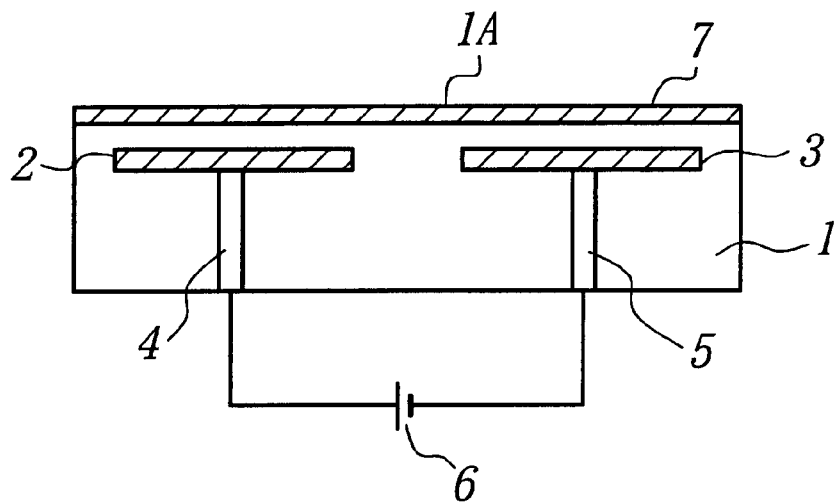
FIG. 1 is a sectional view of a conventional electrostatic chuck.
Figure 2:
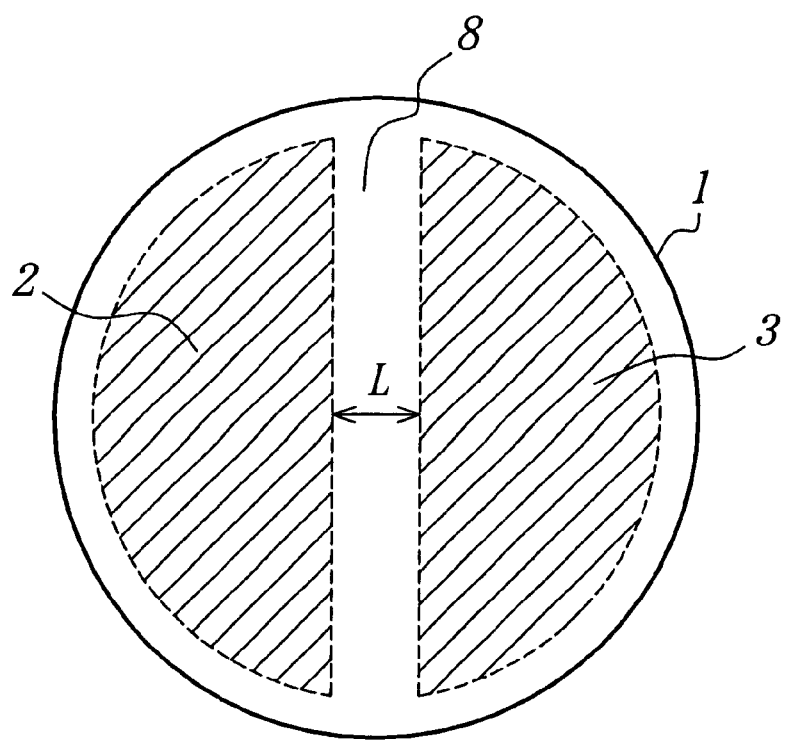
FIG. 2 is a plane view of the conventional electrostatic chuck.

In this Comparative Example, a conventional electrostatic chuck in which D-shaped electrodes were buried as shown in FIGS. 1 and 2 was produced.

By using the same ceramic material and the same metallic electrode material as in the above Example, an electrostatic chuck was completed by forming a substrate 1, in the same manner as in the above Example, in which a positive electrode 2 and a negative electrode 3 each having a diameter of 200 mm were buried.

An Si wafer identical with that in the above Example as an object to be treated was placed on this electrostatic chuck, a DC voltage was applied between the positive electrode 2 and the negative electrode 3 through terminals 4 and 5, respectively, from a DC power source 6, and the above Si wafer was attracted onto the electrostatic chuck in this Comparative Example Next, the same back side gas as in the previous Example was charged in a space between the Si wafer and the substrate through a line not shown, the Si wafer was heated to 350° C. as in Example by heating the substrate 1.

Examination of the temperature distribution of the surface of the Si wafer in the same manner as in the previous Example 1 revealed that the variation was ±10° C. for the above 350° C.

As is clear from the previous Example and the Comparative Example, the electrostatic chuck according to the present invention can uniformly attract the object to be treated, even if the gap between the electrodes is set at a relatively wide distance, and has extremely small variations in the temperature distribution at the surface of the object on heating it so that the object can be uniformly heated.

Although the present invention has been explained based on the above embodiments, the invention is not limited to these embodiments and can be changed and modified in various ways within a range not falling outside the scope of the invention.

In summary, the electrostatic chuck according to the present invention provides for a greatly enhanced uniform attraction of the object to be treated and therefore can uniformly heat the object with small variations in the temperature distribution of the surface of the object.

What is claimed is:

1. An electrostatic chuck comprising a substrate, an inner electrode and an outer electrode each made of a metal and concentrically buried in the substrate, a plurality of embossed portions formed on a main plane of the substrate, and a projecting portion made of the same material as that of said plurality of embossed portions and formed on substantially an entire outer peripheral portion on the main plane of the substrate on which said plurality of embossed portions are formed, wherein positive and negative potentials are to be applied to the inner and outer electrodes, respectively, or vice versa, an object to be treated is to be supported by said plurality of said embossed portions and said projecting portion, and a sum of a total area of upper surfaces of the embossed portions in a zone of the main plane of the substrate in which the outer electrode is located and an area of an upper surface of said projecting portion in the zone of the main plane of the substrate in which the outer electrode is located is in a range of 0.7 to 1.3 of a total area of upper surfaces of the embossed portions in a zone of the main plane of the substrate in which the inner electrode is located.

2. The electrostatic chuck set forth in claim 1, which further comprises a means to flow a back side gas in a space defined by the embossed portions, the projecting portion, the object to be treated, and said main plane of the substrate.

3. The electrostatic chuck set forth in claim 2, wherein an area of the zone of the main plane of the substrate where the outer electrode is located is smaller than that in the zone of the main plane of the substrate where the inner electrode is located, a total area of the upper surfaces of the embossed portions per a unit electrode area in the zone of the main plane of the substrate where the outer electrode is located is larger than a total area of the upper surfaces of the embossed portions per a unit electrode area in the zone of the main plane of the substrate where the inner electrode is located.

4. The electrostatic chuck set forth in claim 3, wherein the inner electrode has a negative potential, and the outer electrode has a positive potential.

5. The electrostatic chuck set forth in claim 2, wherein an area of the zone of the main plane of the substrate where the inner electrode is located is equal to that of the zone of the main plane of the substrate where the outer electrode is located, and a density of the embossed portions in the zone of the main plane of the substrate where the inner electrode is located is larger than that in the zone of the main plane of the substrate where the outer electrode is located.

6. The electrostatic chuck set forth in claim 3, wherein the inner electrode has a negative potential, and the outer electrode has a positive potential.

7. The electrostatic chuck set forth in claim 2, wherein an area of the zone of the main plane of the substrate where the inner electrode is located is larger than that in the zone of the main plane of the substrate where the outer electrode is located, and a density of the embossed portions in the zone of the main plane of the substrate where the inner electrode is located is larger than that in the zone of the main plane of the substrate where the outer electrode is located.

8. The electrostatic chuck set forth in claim 7, wherein the inner electrode has a negative potential, and the outer electrode has a positive potential.

9. The electrostatic chuck set forth in claim 2, wherein the inner electrode has a negative potential, and the outer electrode has a positive potential.

10. The electrostatic chuck set forth in claim 1, wherein an area of the zone of the main plane of the substrate where the inner electrode is located is equal to that of the zone of the main plane of the substrate where the outer electrode is located, and a density of the embossed portions in the zone of the main plane of the substrate where the inner electrode is located is larger than that in the zone of the main plane of the substrate where the outer electrode is located.

11. The electrostatic chuck set forth in claim 10 wherein the inner electrode has a negative potential, and the outer electrode has a positive potential.

12. The electrostatic chuck set forth in claim 1, wherein an area of the zone of the main plane of the substrate where the inner electrode is located is larger than that in the zone of the main plane of the substrate where the outer electrode is located, and a density of the embossed portions in the zone of the main plane of the substrate where the inner electrode is located is larger than that in the zone of the main plane of the substrate where the outer electrode is located.

13. The electrostatic chuck set forth in claim 12, wherein the inner electrode has a negative potential, and the outer electrode has a positive potential.

14. The electrostatic chuck set forth in claim 1, wherein the inner electrode has a negative potential, and the outer electrode has a positive potential.

* * * * *